United States Patent [19]
Shelnut

[11] Patent Number: 6,057,079
[45] Date of Patent: May 2, 2000

[54] DRY FILM PHOTORESIST CONSTRUCTION SUITABLE FOR ROLLING UP ON ITSELF

[75] Inventor: James G. Shelnut, Northboro, Mass.

[73] Assignee: Shipley Company, L.L.C., Marlborough, Mass.

[21] Appl. No.: 08/936,305

[22] Filed: Sep. 24, 1997

[51] Int. Cl.[7] .................................................. G03C 1/76
[52] U.S. Cl. ........................................ 430/272.1; 430/501
[58] Field of Search ............................... 430/272.1, 501, 430/281.1

[56] References Cited

U.S. PATENT DOCUMENTS

| | | | |
|---|---|---|---|
| Re. 28,682 | 1/1976 | Hoey | 428/196 |
| 3,961,961 | 6/1976 | Rich | 96/83 |
| 4,282,310 | 8/1981 | Edhlund | 430/309 |
| 4,293,635 | 10/1981 | Flint et al. | 430/271 |
| 4,992,354 | 2/1991 | Axon et al. | 430/258 |
| 5,213,945 | 5/1993 | Roos et al. | 430/270 |
| 5,229,212 | 7/1993 | Reed | 428/429 |
| 5,326,674 | 7/1994 | Toyama et al. | 430/325 |
| 5,424,120 | 6/1995 | Culbertson | 428/336 |
| 5,489,621 | 2/1996 | Sato et al. | 572/75 |
| 5,494,774 | 2/1996 | Ali et al. | 430/200 |

*Primary Examiner*—Kathleen Duda
*Attorney, Agent, or Firm*—S. Matthew Cairns; Peter F. Corless; Darryl P. Frickey

[57] ABSTRACT

A dry film photoresist construction suitable for rolling up which includes a support layer having a top surface having thereon a thin layer of photoresist adhered thereto, and on the bottom surface a silicone release coating having greater adherence to said support layer than to said photoresist.

9 Claims, 1 Drawing Sheet

DRY FILM PHOTORESIST CONSTRUCTION SUITABLE FOR ROLLING UP ON ITSELF

BACKGROUND OF THE DISCLOSURE

This invention is directed to dry film photoresist constructions and in particular is directed to dry film photoresist constructions which suitably reside in roll form. This invention eliminates the currently used polyethylene protective sheet which is a cause of many photoresist defects and yet can still be applied in a traditional manner. The dry film photoresist of this invention is useful as will be apparent to those skilled in the art for making printed circuit boards such as shown in U.S. Pat. Nos. 5,213,945 and 4,992,354.

A dry film resist is not truly a dry film but rather a very highly viscous liquid which is sandwiched between a carrier sheet and a protective sheet and is subject to flow over the course of time particularly if there are internal stresses from this construction that force the resist to flow. When internal stresses in a typical dry film photoresist cause the resist to flow, the results are thin spots, thin lines, or other areas where film thickness is less than desired as well as areas as the end of the roll when the resist flows out and fuses with other areas of flow. This generates resist chips when unrolled causing other types of defects.

One of these stresses results from the polyethylene (PE) protective sheet currently used in most dry film constructions. Some of these stresses result from gel particles that are typically induced in the PE sheet during the "blown film" process and reside as a protrusion in the surface of the sheet. In the dry film photoresist structure these gel protrusions cause a stress within the roll and cause the highly viscous liquid to flow away from that area to result in a thin spot or ultimately, in a void. This defect transfers itself to the copper innerlayer substrate as a thin coating area on an open area and during such processes, e.g. expose, develop and etch processes or expose, develop and plating processes, the thin spots function as weaknesses in the resist. This results in etchant attack and causes at the very least a thinness of copper lines (neckdown) or a missing portion of a continuous line (mouse bite, effecting impedance control) or at the very worst a line breakage (open). In plating processes these defects result in shorts. Each of these types of defects in the resist reduce and effect the resultant yield of the circuit board producer.

The other area where gel particles in the PE create a limitation in the dry film process is in how thin the coating can be in order to produce finer and finer lines. The thinner the dry film coating the more pronounced will be the effect of the gel. If a coating is already thin, the gel does not have to put on it too much stress to cause the resist to flow. In cases where the dry film is very thin, about 1.0 mil and below, the resist can flow enough to cause a complete loss of coating resulting in a void which will create an open, or cut line on plating or a short, in the final circuit board obtained after processing.

Other types of cover protective films are less desirable due to cost or their inability to function in a rolled up capacity. Complete removal of the PE and allowing the polyethylene terephalate (PET) layer covered resist to roll up against itself is problematic in that the resist has no memory and over time will adhere to the "backside" of the PET as well as the "front" side. Also waste treatment of PE can be an added cost to circuit board production. For further background information, see for example U.S. Pat. Nos. 5,213,945 and 4,992,354 cited above for a disclosure of dry film photoresist products and photoresists therefore. The entire contents of these patents are incorporated herein by reference hereto.

BRIEF DESCRIPTION OF THE INVENTION

The present dry film construction disclosed herein utilizes a conventional support sheet having an upper (top) and a back (bottom) surface and edges. The support sheet is plastic and is preferably flexible and more preferably of a polyester material and is most preferably polyethylene terephthalate such as sold under the brand name MYLAR®. On one surface of the support sheet is coated a release coating. On the reverse side is coated a resist, which may be photoimageable.

In this way, when the dry film construction is unrolled, the photoresist readily separates from the release coating and is then ready to be applied in the same manner as the conventional dry film photoresist, but without the need of removing and disposal of the PE cover sheet.

The release coating used on one side of the support sheet may be silicone agents blended with polymeric binders formulated for release characteristics but are readily adhesive to the support sheet either through chemical adhesion or pretreatment of the one side of the support sheet intended for adhesion to the release formulation. Other types of release coatings include long branched polymers, polyvinyl carbamates, fluorocarbons and the like. One particular requirement of the release coating is that it does not transfer to the surface of the resist and limit the ability of the resist to adhere to a metallic substrate such as copper, nickel, gold, etc.

A particularly useful release coating is based on photocured, electron beam cured, or thermally cured silicone release coatings. These materials are coated thinly (approximately 0.03 mil) onto one surface of the support film and treated by either actinic radiation, electron beam or thermal cure, depending on the silicon release coating formulation. These systems show minimal to no transfer of the release coating due to the process of curing.

Reference should be made to *Handbook of Pressure Sensitive Adhesive Technology* by Donastas Satas, 2nd edition, Van Nostrand Reinhold, New York, 1989, pages 585–626 which describes release coatings known in the art.

DETAILED DESCRIPTION OF THE DISCLOSURE

Figure 1:
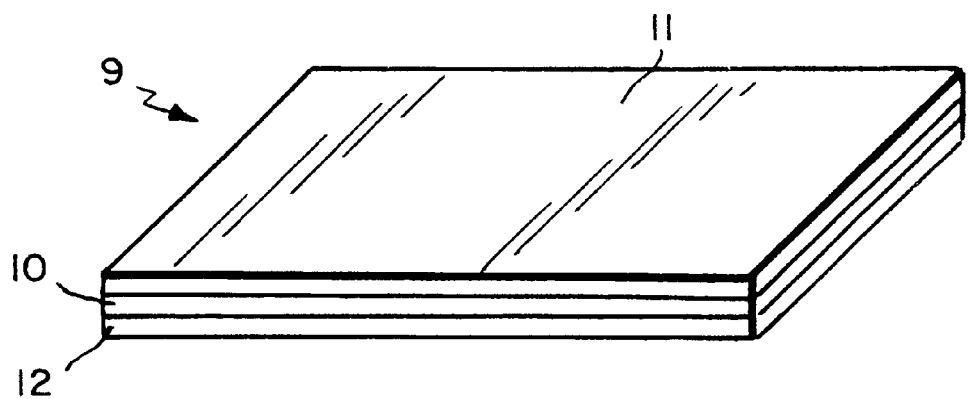
FIG. 1 is a side view of the dry film resist construction of the invention.
Figure 2:
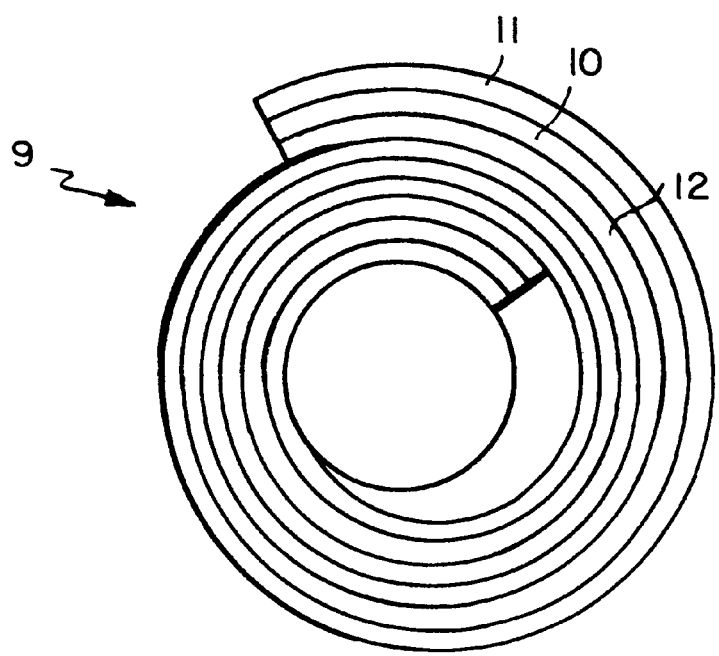
FIG. 2 is a view of the dry film resist construction rolled up on itself.

Reference should now be had to FIG. 1 for a description of the dry film construction of the disclosure.

In FIG. 1, there is shown a support sheet 10, e.g., of polyethylene terephthalate, 2 mils or less having adhered to the top surface thereof a coating of a resist material (i.e., photoimageable material) 11 e.g., 5 mils or less in thickness.

The resist material may be any of those conventionally used in the field of dry film constructions for making printed circuit boards and may be photoimageable. See the aforementioned cited patents for a description of photoresists. Suitable photoresists useful as a dry film conventionally include resin, crosslinkable oligomers, crosslinking agents activated by radiation and other agents commonly used. The photoresist may be a negative or positive photoresist.

On the underside (back) of the windable support sheet 10, a silicone based release coating 12 is coated on sheet 10. The release coating is selected so that it is more adherent to said support layer 10 than to the photoresist 11. One side of the support sheet 10 may be pretreated to accept the release coating.

The dry film construction is rolled up upon itself with the photoresist in surface contact with the release coating 12. The dry film construction is generally wound over itself on an inert plastic core (not shown) for supporting same during unrolling of same when in use in making printed circuit boards.

Release coatings suitable for this invention are available from GE Silicones, Rhone Poulenc, Shinetsu, Goldschmidt, and Dow.

The present invention is of utmost importance where the photoresist coating is very thin about 5 mils or less in thickness. In these cases, the use of a rolled up conventional polyethylene protective sheet over the photoresist results, as mentioned previously, in many defects in the electrically conductive connecting lines of the circuit board after processing.

With the above construction, products are readily constructed while avoiding the major problems with certain top sheet materials such as polyethylene.

It should be understood that the present invention is applicable to photoresist layers of greater than 5 mils in thickness, however it is much more important in these cases where the resist is less than 5 mil. It is also applicable to positive photoresists.

A typical photoresist composition as is well known in the prior art is prepared by mixing:

a) A polyacrylate containing sufficient acid groups to be soluble in carbonate developer, e.g., Carboset® 527 from BF Goodrich;

b) Acrylate monomers which will cure upon contact with free radical initiator, e.g., SR454 from Sartomer Corp; and c) A free radical initiator which generates free radicals upon exposure to actinic radiation, e.g., Irgacure 184 from Ciba Geigy.

Any number of additional ingredients including dyes, photosensitizers, leveling agents, adhesion promoters, etc. may be added is conventional in the art.

The photoresist compositions used in this invention are well known in the art and accordingly it should be understood that they should not limit the scope of the invention.

The following example is provided as exemplative of the method for producing the dry film construction of the disclosure.

EXAMPLE 2

To a 2 mil thick polyethyleneterephthate film substrate (PET) is applied a 100% solids blend of an epoxy silicon polymer, UV 9315 from GE silicones, with a UV cure material, UV 9380C from GE Silicones, mixed in a ratio of 100:2. The material is applied by three roll gravure coating to a thickness of 0.3 mils. This wet coating is then exposed to UV lamps with power of 300 watts per inch. The web upon which the release coating has been applied is moving at 50–100 ft/min under so that the lamps may expose the coating to form a hard, dry and scratch resistant characteristic.

To the reverse side of the film is applied any of the well known prior art photoresists from 0.1 to 5 mil in thickness. The coating is dried in a conventional convection oven and rolled upon itself over a 6 inch core in a winding operation.

When the film is unrolled, the resist will remain on the surface of the PET such that in a dry film lamination process, there is no need for a polyethylene removal roll, there is no need to waste treat the resultant polyethylene film waste and there will be clean unwinding of the dry film roll during the lamination process.

It should be noted that if the PET is coated with the photoresist, and rolled up on itself without the silicone release coating treatment, the resist will adhere to both sides of the PET and be unusable in a dry film lamination process as major portions of the dry film will be on the backside of the PET substrate and consequently will not be transferred.

I claim:

1. A roll of dry film photoresist construction comprising windable support sheet having two surfaces, a layer of photoresist composition supported by and attached to said support sheet on one side thereof, and a radiation-cured silicone release coating supported on and attached to the opposite side of said support sheet than said photoresist composition, said silicone release coating contact said photoimageable composition as rolled up upon itself, said photoresist composition is more adherent to said support sheet than to said release coating.

2. The construction of claim 1 in which the support sheet is a polyester.

3. The construction of claim 2 in which the polyester is polyethylene terephthalate.

4. The construction of claim 1 in which the photoresist composition is a negative photoresist composition.

5. The construction of claim 1 in which said layer of photoresist composition is about 5 mils or less in thickness.

6. A dry film photoresist construction for winding on itself comprising a flexible support layer having top and bottom surfaces suitable for winding into a roll, a photoresist composition adhered to one of said surfaces of said flexible support layer, and a radiation-cured silicone release coating adhered to the opposite side of said layer, said photoresist composition more adherent to said support.

7. The construction of claim 6 in which the release coating is a silicone release coating and in which the support layer is a polyester.

8. The construction of claim 7 in which the said polyester is polyethylene terephtalate.

9. The construction of claim 6 in which said photoresist composition on said surface is of a thickness of 5 mils or less.

* * * * *